United States Patent
Nikoukary et al.

(10) Patent No.: US 11,742,277 B2
(45) Date of Patent: Aug. 29, 2023

(54) PACKAGED INTEGRATED DEVICE HAVING MEMORY BUFFER INTEGRATED CIRCUIT ASYMMETRICALLY POSITIONED ON SUBSTRATE

(71) Applicant: Rambus Inc., San Jose, CA (US)

(72) Inventors: Shahram Nikoukary, Mountain View, CA (US); Jonghyun Cho, Santa Clara, CA (US); Nitin Juneja, Fremont, CA (US); Ming Li, Fremont, CA (US)

(73) Assignee: Rambus Inc., San Jose, CA (US)

( * ) Notice: Subject to any disclaimer, the term of this patent is extended or adjusted under 35 U.S.C. 154(b) by 44 days.

(21) Appl. No.: 17/264,231

(22) PCT Filed: Aug. 12, 2019

(86) PCT No.: PCT/US2019/046176
§ 371 (c)(1),
(2) Date: Jan. 28, 2021

(87) PCT Pub. No.: WO2020/036878
PCT Pub. Date: Feb. 20, 2020

(65) Prior Publication Data
US 2021/0305142 A1    Sep. 30, 2021

Related U.S. Application Data

(60) Provisional application No. 62/795,968, filed on Jan. 23, 2019, provisional application No. 62/718,726, filed on Aug. 14, 2018.

(51) Int. Cl.
*H01L 23/498*    (2006.01)

(52) U.S. Cl.
CPC .. *H01L 23/49838* (2013.01); *H01L 23/49816* (2013.01)

(58) Field of Classification Search
CPC .................. H01L 23/49838; H01L 23/49816; G11C 5/04
See application file for complete search history.

(56) References Cited

U.S. PATENT DOCUMENTS

| | | |
|---|---|---|
| 6,972,981 B2 | 12/2005 | Ruckerbauer et al. |
| 7,038,326 B2 | 5/2006 | Poulin |

(Continued)

FOREIGN PATENT DOCUMENTS

WO    WO-2013-052345 A1    4/2013

OTHER PUBLICATIONS

Notification of Transmittal of the International Search Report and the Written Opinion of the International Searching Authority, or the Declaration dated Oct. 31, 2019 re: Int'l Appln. No. PCT/US19/046176. 13 Pages.

(Continued)

*Primary Examiner* — Michael Jung
(74) *Attorney, Agent, or Firm* — The Neudeck Law Firm, LLC

(57) ABSTRACT

Disclosed is an integrated circuit die of a memory buffer integrated circuit that is placed aggregately closer to the solder balls that connect to the input (i.e., host command/address—C/A) signals than the output solder balls (i.e., memory device C/A) signals. This decreases the length of the host C/A signals from the memory controller to the memory buffer device when the memory module is placed in a system.

19 Claims, 6 Drawing Sheets

(56) References Cited

U.S. PATENT DOCUMENTS

| | | |
|---|---|---|
| 7,061,784 B2 | 6/2006 | Jakobs et al. |
| 7,375,435 B2 | 5/2008 | Wang et al. |
| 7,386,696 B2 | 6/2008 | Jakobs et al. |
| 7,453,713 B2 | 11/2008 | Kim et al. |
| 7,466,577 B2 | 12/2008 | Sekiguchi et al. |
| 7,562,271 B2 | 7/2009 | Shaeffer et al. |
| 7,581,070 B2 | 8/2009 | Cho et al. |
| 7,692,983 B2 | 4/2010 | Lee et al. |
| 7,821,127 B2 | 10/2010 | Lee et al. |
| 7,851,898 B2 | 12/2010 | Nakamura et al. |
| 7,999,367 B2 | 8/2011 | Kang et al. |
| 8,094,504 B2 | 1/2012 | Smolka |
| 8,209,460 B2 | 6/2012 | Lee |
| 8,610,288 B2 | 12/2013 | Handa |
| 8,723,303 B2 | 5/2014 | Nasu et al. |
| 8,917,571 B2 | 12/2014 | Chow et al. |
| 8,929,117 B2 | 1/2015 | Matsunaga |
| 9,076,500 B2 | 7/2015 | Osanai et al. |
| 9,122,611 B2 | 9/2015 | Yeh |
| 9,391,048 B2 | 7/2016 | Lee |
| 9,747,037 B2 * | 8/2017 | Cai .................. G11C 11/4076 |
| 9,780,049 B2 | 10/2017 | Ahn et al. |
| 9,812,186 B2 | 11/2017 | Ruan et al. |
| 9,947,644 B2 | 4/2018 | Hong et al. |
| 9,991,226 B2 | 6/2018 | Park |
| 2008/0080261 A1 | 4/2008 | Shaeffer et al. |
| 2009/0327565 A1 * | 12/2009 | Ware .................. G06F 13/4072 |
| | | 710/305 |
| 2010/0091537 A1 | 4/2010 | Best et al. |
| 2011/0140105 A1 | 6/2011 | Maruyama et al. |
| 2013/0194854 A1 * | 8/2013 | Shaeffer ................ G11C 5/063 |
| | | 365/63 |
| 2014/0289574 A1 * | 9/2014 | Tsern ............... G11C 29/50016 |
| | | 714/718 |
| 2016/0172332 A1 | 6/2016 | Haba et al. |

OTHER PUBLICATIONS

EP Extended European Search Report dated Apr. 8, 2022 re: EP Appln. No. 19849924.6. 9 pages.

* cited by examiner

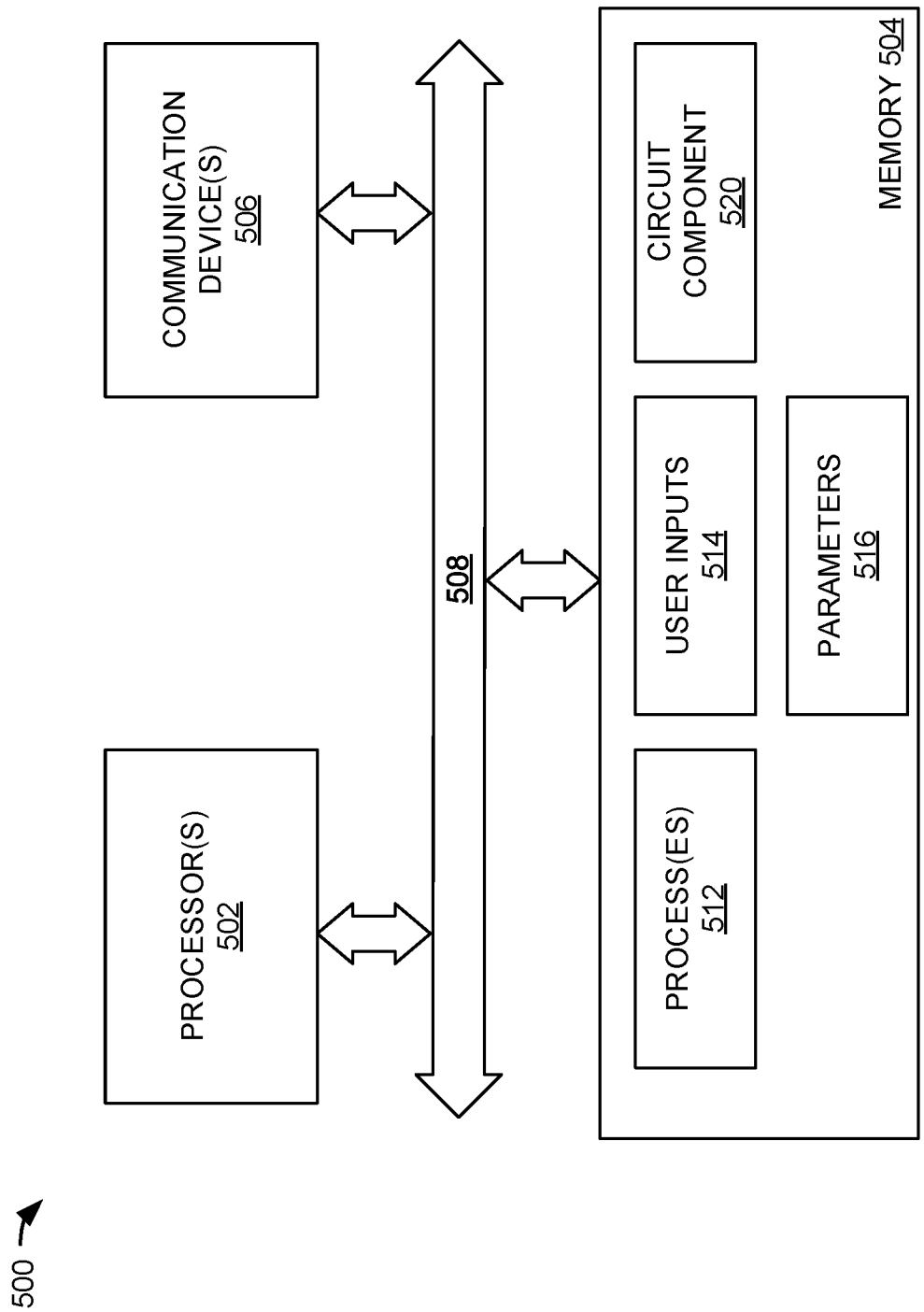

PACKAGED INTEGRATED DEVICE HAVING MEMORY BUFFER INTEGRATED CIRCUIT ASYMMETRICALLY POSITIONED ON SUBSTRATE

BRIEF DESCRIPTION OF THE DRAWINGS

FIG. 5 is a block diagram illustrating a processing system.

DETAILED DESCRIPTION OF THE EMBODIMENTS

This application relates to computer memory systems. More particularly, electronic buffer components deployed on a memory module of a computer system are described. A typical memory module based computer memory system connects a processor and/or memory controller (a.k.a., host) to one or more socketed memory modules via a memory bus. The memory bus includes data connections (DQ) and command/address (C/A) connections. Registered (also called buffered) memory modules (e.g., RDIMM, LRDIMM, etc.) have a registered clock driver device (RCD) on the command/address signals between the system's memory controller and the DRAM devices on the module. The RCD is typically placed on the memory module. A single RCD on the module places less electrical load on the C/A signals coming from the memory controller and thereby allows systems to with more memory modules than they would have without using registered memory modules.

In a typical arrangement, a given C/A signal goes from the memory controller to a relatively small number of RCD devices (e.g., 1 or 2) that are on respective memory modules. These connections have relatively long signal trace lengths. From the RCD device on the module, that signal may be connected to 10 or 20 DRAM memory devices. However, these connections have relatively shorter signal trace lengths. In an embodiment, the signaling frequency of the C/A bus from the memory controller to the RCD (a.k.a., host side) is the same as the signaling frequency from the RCD to the DRAM memory device (a.k.a., back side). In another embodiment, however, the back side C/A signaling frequency is half the host side C/A signaling frequency.

In an embodiment, the integrated circuit die of a memory buffer integrated circuit (a.k.a., RCD) is placed aggregately closer to the solder balls that connect to the input (i.e., host command/address—C/A) signals than the output solder balls (i.e., memory device C/A) signals. This decreases the length of the host C/A signals from the memory controller to the memory buffer device when the memory module is placed in a system. This decrease in host C/A signaling length can improve the overall electrical (e.g., signal eye) performance of the memory system.

Figure 1A:
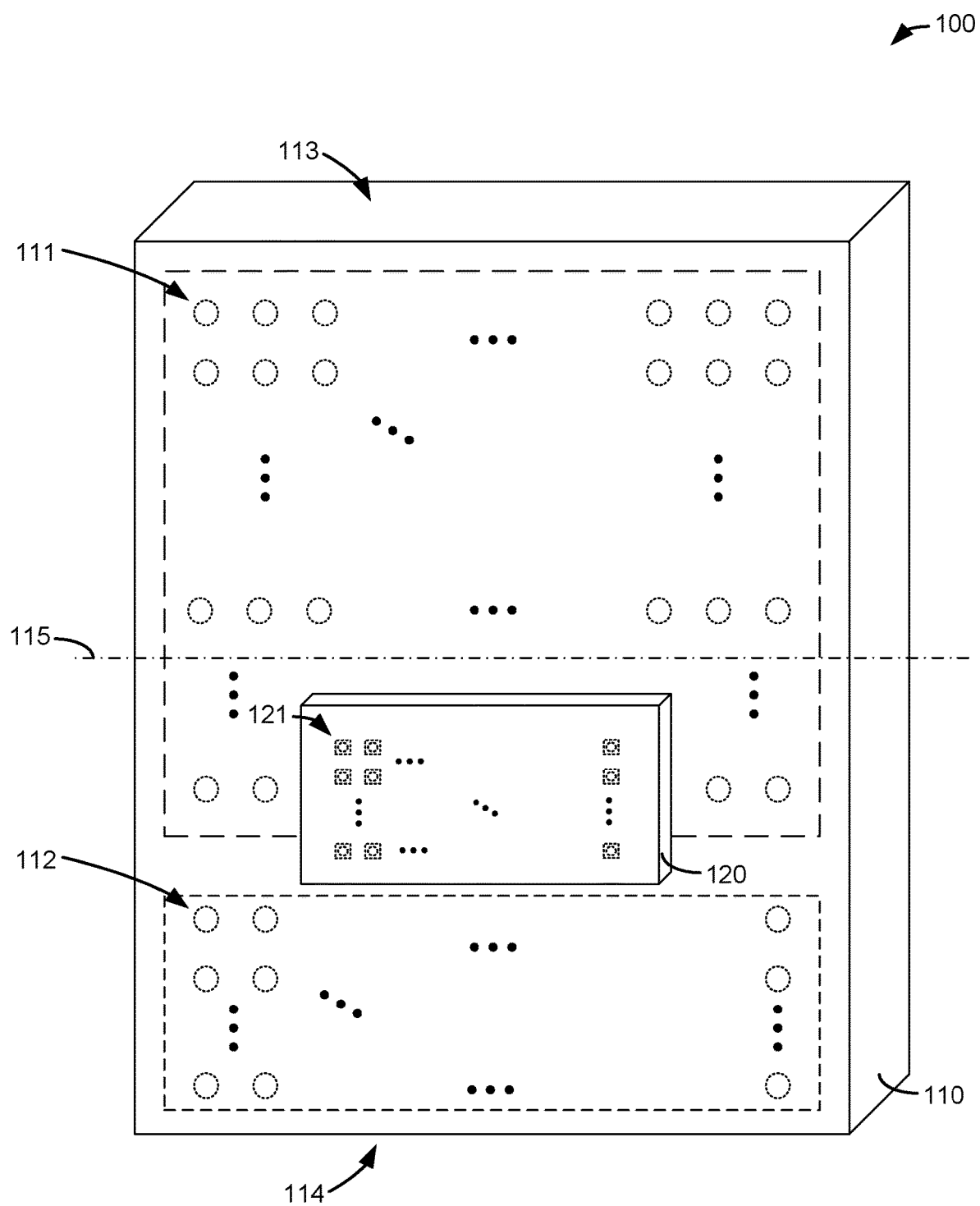
FIG. 1A is a diagram illustrating a packaged integrated device.

FIG. 1A is a diagram illustrating a packaged integrated device. Packaged integrated device 100 includes package substrate 110 and memory buffer integrated circuit 120. In FIG. 1, package substrate 110 is substantially rectangular in shape. A first edge 113 of the rectangular shape and a second edge 114 of the rectangular shape are opposite each other and therefore substantially parallel. The first edge 113 and the second edge 114 define a (horizontal in FIG. 1A) centerline 115 of the package substrate that is substantially parallel to the first edge 113 and the second edge 114 and substantially equidistant between the first edge 113 and the second edge 114.

In FIG. 1, connection conductors (e.g., solder balls) 111-112 on the opposite side of substrate 110 from the viewer are illustrated as dotted line circles. Connection conductors 111 are disposed in a rectangular grid over an area that runs from around the first edge 113 to below (in FIG. 1A) centerline 115. Connection conductors 111 are configured to interface to at least one memory device. For example, connection conductors 111 may be configured to be connected (e.g., soldered) to signal traces on a memory module that are further connected to at least one memory device.

Connection conductors 112 are disposed in a rectangular grid over an area that runs from the end of connection conductors 111 to around the second edge 114. Connection conductors 112 are configured to interface to a host device. For example, connections conductors 112 may be configured to be connected (e.g., soldered) to signal traces on a memory module that are further connected to a memory module (e.g., dual in-line memory module) connected with is further connected to a memory controller (and/or additional memory modules.)

Memory buffer integrated circuit 120 is mounted to substrate 110 is a flip-chip manner. In other words, memory buffer integrated circuit 120 has pads (illustrated as dotted squares) that are affixed to substrate 110 via solder balls 121 (illustrated as dotted circles within the dotted squares) on the opposite side of substrate integrated circuit 120 from the viewer.

Figure 1B:
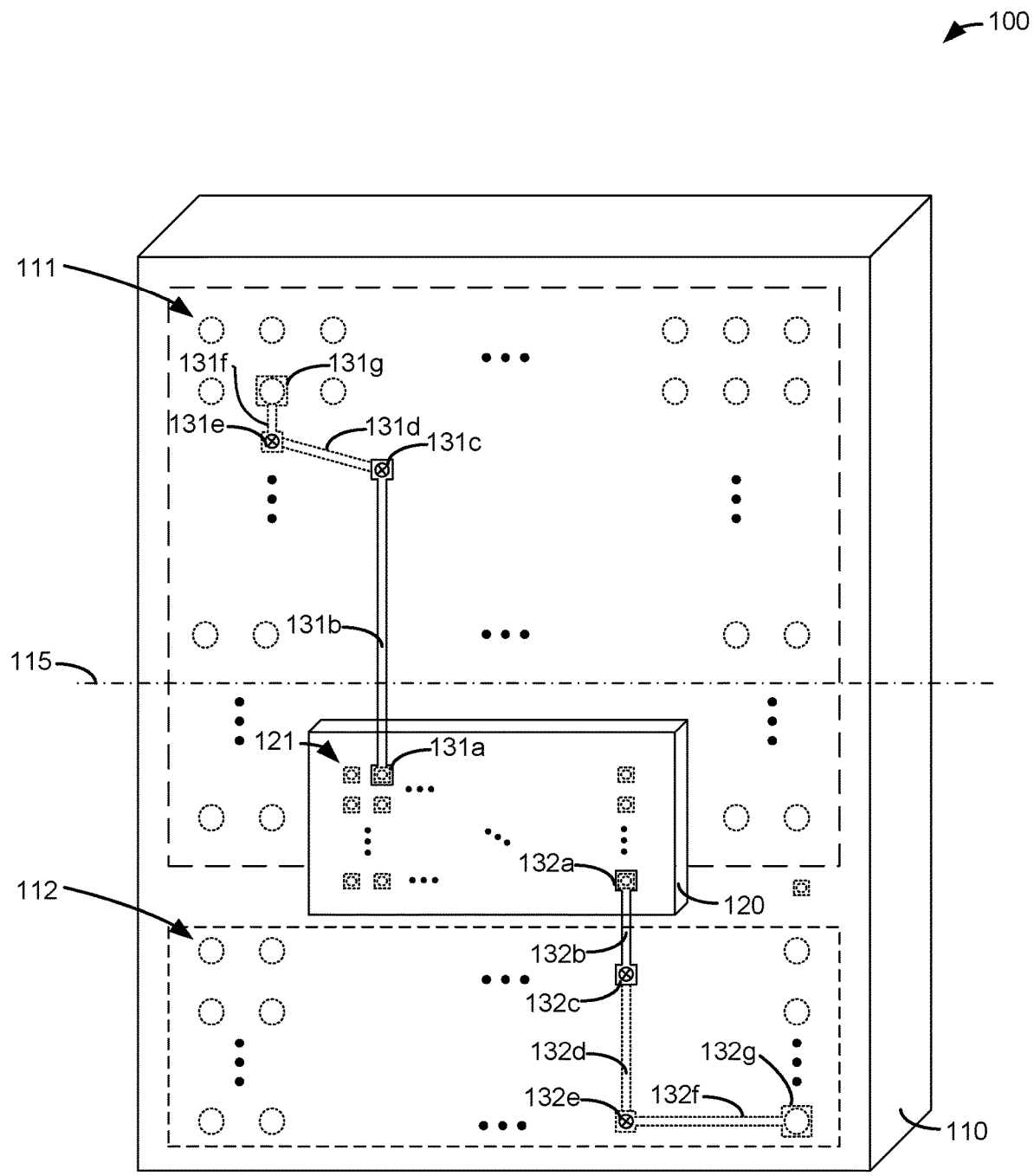
FIG. 1B is a diagram illustrating example signal conductor routing lengths.

FIG. 1B is a diagram illustrating example signal conductor routing lengths. FIG. 1B illustrates packaged integrated device 100 with additional detail of example signal conductors 131-132 on and in substrate 110. Example signal conductor 131 is comprised of example integrated circuit ball connection pad 131a, example surface routing trace 131b, example via 131c, example buried routing trace 131d, example via 131e, example buried routing trace 131f, and example ball pad 131g. Example signal conductor 132 is comprised of example integrated circuit ball connection pad 132a, example surface routing trace 132b, example via 132c, example buried routing trace 132d, example via 132e, example buried routing trace 132f, and example ball pad 131g. Example ball pad 131g and example ball pad 132g are the opposite side of substrate 110 from the viewer in and are thus illustrated using dotted lines in FIG. 1B.

It should be understood from FIGS. 1A-1B that since integrated circuit 120 is disposed asymmetrically with respect to centerline 115, the average distance from integrated circuit 120 to host connection conductors 112 is less than the average distance from integrated circuit 120 to memory device connection conductors 111. Thus, the average length of the signal conductors (e.g., signal conductor 132) running from integrated circuit 120 to host connection conductors 112 is less than the average length of the signal conductors (e.g., signal conductor 131) running from integrated circuit 120 to memory device connection conductors 111.

It should be understood that, when compared to symmetrical positioning of integrated circuit 120, the asymmetrical disposition of integrated circuit 120 decreases host C/A routing length and increases back side C/A routing length. Thus, selecting an optimal position (e.g., by simulation) for integrated circuit 120 in light the electrical and/or physical characteristics of the memory system may desirable. For example, based simulations and memory channel characterizations, it has been determined that selecting a position that decreases host C/A signal lengths to the die of integrated circuit 120 helps the overall system when compared to a symmetrical disposition of integrated circuit 120.

Figure 2:
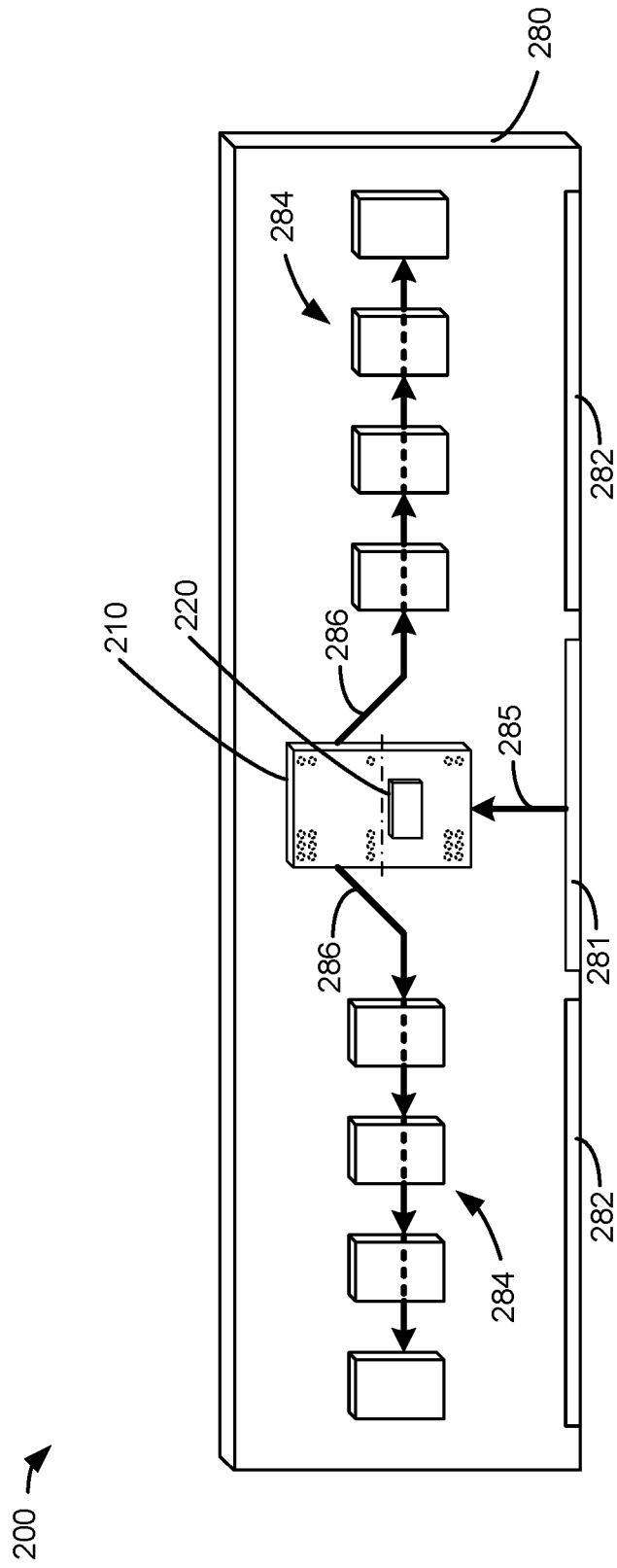
FIG. 2 is a diagram illustrating memory module with a packaged memory buffer.

FIG. 2 is a diagram illustrating memory module with a packaged memory buffer. In FIG. 2, memory module 200 comprises package substrate 210 with memory buffer integrated circuit 220, module substrate 280, host command/address (CA) interface 281, data interface 282, memory devices 284, host command/address signal conductors 285, and memory device command/address signal conductors 286. Host command/address signal conductors 285 operatively couple host command/address signals from command/address interface 281 to package substrate 210. Packaged integrated device 220 operatively couples host command/address signals to memory buffer integrated circuit 220.

Memory buffer integrated circuit 220 relays the host command/address signals to memory devices 286. Memory buffer integrated circuit 220 relays the host command/address signals to memory devices 284 via signal connections/traces of packaged integrated device 220 and memory device command/address signal conductors 286. In an embodiment, the host side C/A signals may be amplified and/or timing-adjusted by the RCD before being transmitted to memory devices. In another embodiment, the RCD adapts a host C/A signaling frequency that is twice the signaling frequency going to the memory device to the memory device signaling frequency.

In an embodiment, memory buffer integrated circuit 220 is disposed asymmetrically with respect to the centerline of package substrate 210. The average distance from solder balls connecting package substrate 210 to host command/address signal conductors 285 on substrate 280 to integrated circuit 220 is less than the average distance from integrated circuit 220 to memory device command/address signal conductors 286 on substrate 280. Thus, the average length of the signal conductors (e.g., signal conductor 132) running from host command/address signal conductors 285 to integrated circuit 220 is less than the average length of the signal conductors (e.g., signal conductor 131) running from integrated circuit 220 to memory device command/address signal conductors 286.

Figure 3:
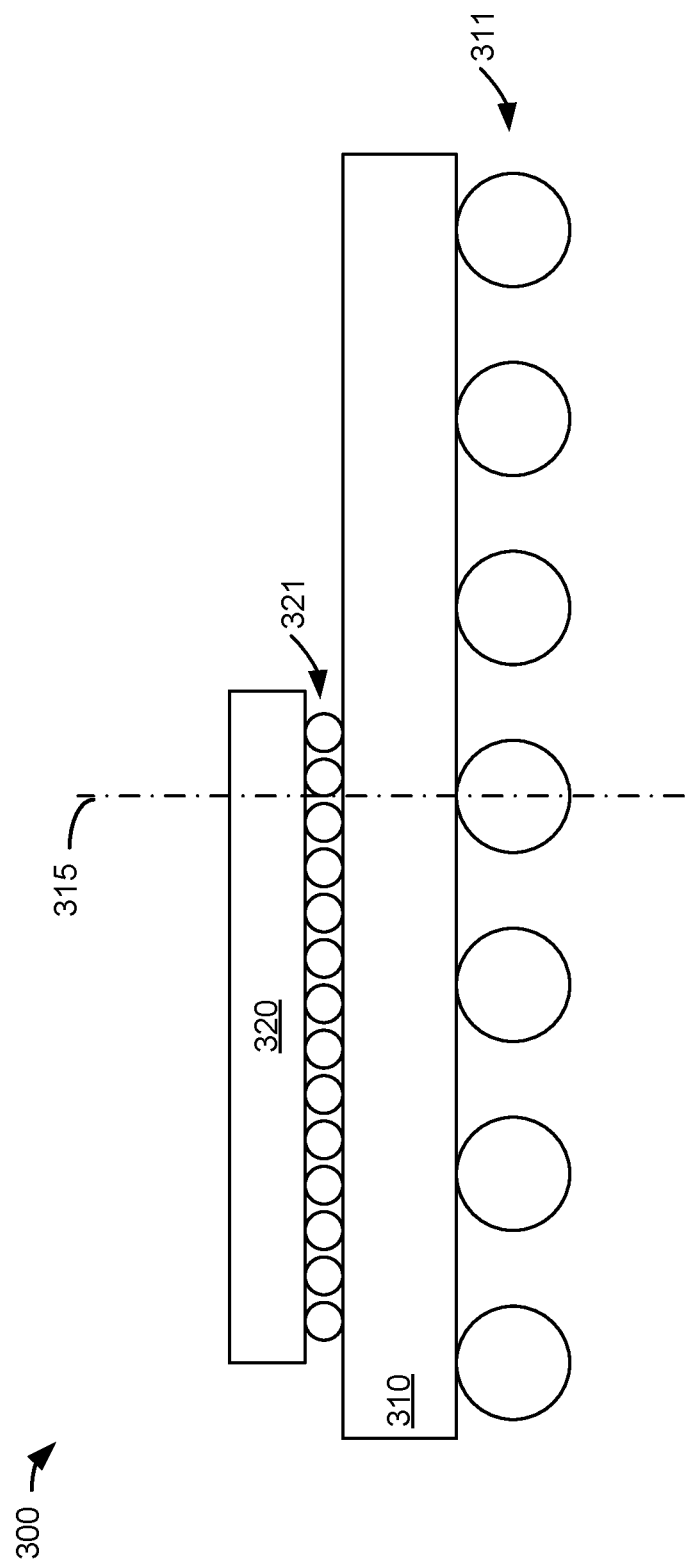
FIG. 3 is a diagram illustrating a flip-chip mounted integrated circuit on a ball grid array (BGA) package.

FIG. 3 is a diagram illustrating a flip-chip mounted integrated circuit on a ball grid array (BGA) package. In FIG. 3, ball-grid array (BGA) package 300 comprises package substrate 310, memory buffer integrated circuit 320, flip-chip solder balls 321, and package solder balls 311. Flip-chip solder balls 321 electrically and physical connect memory buffer integrated circuit 320 to package substrate 311. Flip-chip solder balls 321 may comprise conductive bumps.

Package solder balls 311 include host command/address signal balls connected to host command/address signal conductors, and memory device command/address signal balls connected to memory device command/address signal conductors. Memory buffer integrated circuit 320 is mounted to the package substrate 310 and offset from a center axis 315 of the package substrate 310. The host command/address signal conductors on substrate 310 connect to host flip-chip solder balls 321 that couple to host command/address interface circuits on memory buffer integrated circuit 320. Memory device command/address signal conductors on substrate 310 connect to memory device flip-chip solder balls 321 that coupled to command/address interface circuits on memory buffer integrated circuit 320. The average length of the host command/address signal conductors is less than an average length of the memory device command/address signal conductors.

It should be understood that memory buffer integrated circuit 320 is mounted to package substrate 310 with its active circuitry facing package substrate 310. Thus, the host and memory device command/address interface circuits are facing package substrate 310. In an embodiment, memory buffer integrated circuit 310 is configured to receive and transmit signals that conform to standardized specifications. Each length of the host command/address signal conductors on substrate 310 is less than the average length of the memory device command/address signal conductors on substrate 310. In an embodiment, each length of the host command/address signal conductors on substrate 310 is less than each length of the corresponding memory device command/address signal conductors on substrate 310.

Figure 4:
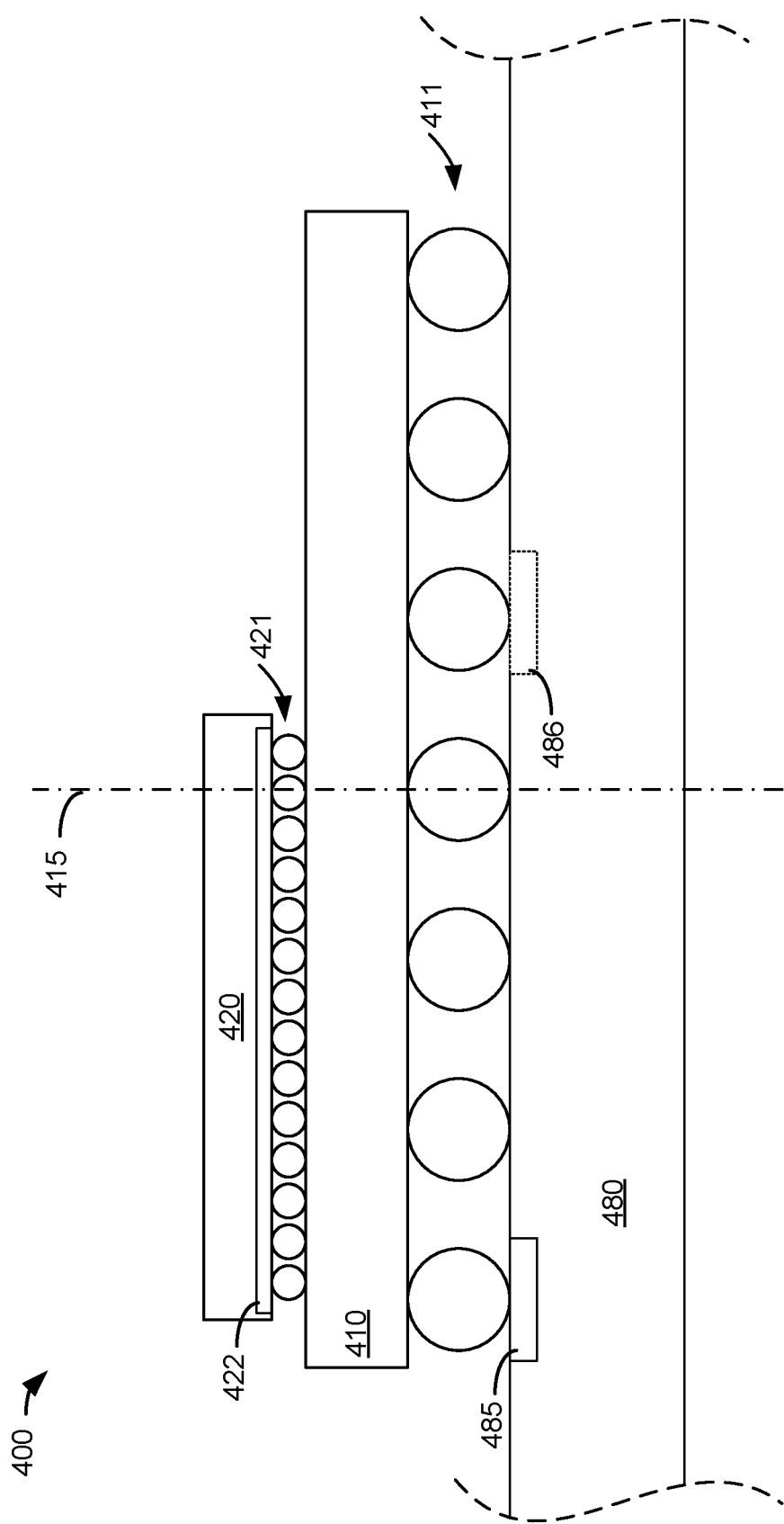
FIG. 4 is a diagram illustrating BGA mounted to a module.

FIG. 4 is a diagram illustrating a BGA package mounted to a module. In FIG. 4, module 400 comprises package substrate 410, flip-chip solder balls 421, package solder balls 411, memory buffer integrated circuit 420, module substrate 480, host command/address signal conductors 485, and memory device command/address signal conductors 486. Flip-chip solder balls 421 electrically and physical connect memory buffer integrated circuit 420 to package substrate 411. Flip-chip solder balls 421 may comprise conductive bumps. Memory buffer integrated circuit 420 includes active circuitry 422.

Host command/address signal conductors 485 operatively couple host command/address signals from a command/address interface to package substrate 410. Substrate 410 operatively couples host command/address signals received via host command/address signal conductors 485 and solder balls 411 to memory buffer integrated circuit 420 via flip-chip solder balls 421.

Memory buffer integrated circuit 420 transmits copies of the host command/address signals to memory devices via flip-chip solder balls 421, substrate 410, package solder balls 411, and memory device command/address signal conductors 486.

In an embodiment, memory buffer integrated circuit 420 is disposed asymmetrically with respect to the centerline of package substrate 410. The average distance from integrated circuit 420 flip-chip solder balls 421 connecting package substrate 410 to host command/address signal conductors 485 on substrate 480 is less than the average distance from integrated circuit 420 flip-chip solder balls 421 connecting package substrate 410 to memory device command/address signal conductors 486 on substrate 480. Thus, the average length of the signal conductors (e.g., signal conductor 132) running from integrated circuit 420 to host command/address signal conductors 485 is less than the average length of the signal conductors (e.g., signal conductor 131) running from integrated circuit 420 to memory device command/address signal conductors 486.

It should be understood that, in an embodiment, memory buffer integrated circuit 420 is mounted to package substrate 410 with its active circuitry 422 facing package substrate 410. Thus, the host and memory device command/address interface circuits are facing package substrate 410. In an embodiment, memory buffer integrated circuit 410 is configured to receive and transmit signals that conform to standardized specifications. In an embodiment, each length of the host command/address signal conductors on substrate 410 is less than the average length of the memory device command/address signal conductors on substrate 410. In an embodiment, each length of the host command/address signal conductors on substrate 410 is less than each length of the corresponding memory device command/address signal conductors on substrate 410.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of packaged integrated device 100, memory module 200, ball-grid array (BGA) package 300, ball-grid array (BGA) package 400, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

FIG. 5 is a block diagram illustrating one embodiment of a processing system 500 for including, processing, or generating, a representation of a circuit component 520. Processing system 500 includes one or more processors 502, a memory 504, and one or more communications devices 506. Processors 502, memory 504, and communications devices 506 communicate using any suitable type, number, and/or configuration of wired and/or wireless connections 508.

Processors 502 execute instructions of one or more processes 512 stored in a memory 504 to process and/or generate circuit component 520 responsive to user inputs 514 and parameters 516. Processes 512 may be any suitable electronic design automation (EDA) tool or portion thereof used to design, simulate, analyze, and/or verify electronic circuitry and/or generate photomasks for electronic circuitry. Representation 520 includes data that describes all or portions of packaged integrated device 100, memory module 200, ball-grid array (BGA) package 300, ball-grid array (BGA) package 400, and their components, as shown in the Figures.

Representation 520 may include one or more of behavioral, register transfer, logic component, transistor, and layout geometry-level descriptions. Moreover, representation 520 may be stored on storage media or communicated by carrier waves.

Data formats in which representation 520 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 514 may comprise input parameters from a keyboard, mouse, voice recognition interface, microphone and speakers, graphical display, touch screen, or other type of user interface device. This user interface may be distributed among multiple interface devices. Parameters 516 may include specifications and/or characteristics that are input to help define representation 520. For example, parameters 516 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 504 includes any suitable type, number, and/or configuration of non-transitory computer-readable storage media that stores processes 512, user inputs 514, parameters 516, and circuit component 520.

Communications devices 506 include any suitable type, number, and/or configuration of wired and/or wireless devices that transmit information from processing system 500 to another processing or storage system (not shown) and/or receive information from another processing or storage system (not shown). For example, communications devices 506 may transmit circuit component 520 to another system. Communications devices 506 may receive processes 512, user inputs 514, parameters 516, and/or circuit component 520 and cause processes 512, user inputs 514, parameters 516, and/or circuit component 520 to be stored in memory 504.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A packaged integrated device, comprising:
   a package substrate having a first plurality of connection conductors and a second plurality of connection conductors, the first plurality of connection conductors and the second plurality of connection conductors comprising solder balls;
   the package substrate having a surface that is substantially rectangular, the substantially rectangular surface having a first edge and a second edge, the first edge and the second edge defining a package centerline that is substantially parallel to the first edge and the second edge and substantially equidistant between the first edge and the second edge;
   a memory buffer integrated circuit die mounted to the surface, the memory buffer integrated circuit die having a first plurality of die connections connected to the first plurality of connection conductors via a first plurality of signal conductors, the memory buffer integrated circuit die having a second plurality of die connections connected to the second plurality of connection conductors via a second plurality of signal conductors, the memory buffer integrated circuit die configured to receive at least a first plurality of command/address signals from a host via the first plurality of die connections, the memory buffer integrated circuit die configured to transmit a second plurality of command/address signals to at least one memory device via the second plurality of die connections;

the first plurality of connection conductors disposed between the package centerline and the first edge, the second plurality of connection conductors disposed between the first plurality of connection conductors and the second edge; and the memory buffer integrated circuit die disposed such that a first average distance from the memory buffer integrated circuit die to the first plurality of connection conductors is less than a second average distance from the memory buffer integrated circuit die to the second plurality of connection conductors.

2. The packaged integrated device of claim 1, wherein the memory buffer integrated circuit die is mounted to the surface with the first plurality of die connections and second plurality of die connections facing the surface.

3. The packaged integrated device of claim 1, wherein a majority of lengths of the first plurality of signal conductors is less than a majority of lengths of the second plurality of signal conductors.

4. The packaged integrated device of claim 1, wherein a first average length of the first plurality of signal conductors is less than a second average length of the second plurality of signal conductors.

5. The packaged integrated device of claim 1, wherein each length of the first plurality of signal conductors is less than an average length of the second plurality of signal conductors.

6. The packaged integrated device of claim 1, wherein each length of the first plurality of signal conductors is less than each length of the second plurality of signal conductors.

7. A packaged integrated circuit, comprising:
a package substrate comprising host command/address signal balls connected to host command/address signal conductors, and memory device command/address signal balls connected to memory device command/address signal conductors;

a memory buffer integrated circuit mounted to the package substrate and offset from a center axis of the package substrate, the host command/address signal conductors being connected to host die connections that couple to host command/address interface circuits on the memory buffer integrated circuit, the memory device command/address signal conductors being connected to memory device die connections that coupled to command/address interface circuits on the memory buffer integrated circuit; and a majority of lengths of the host command/address signal conductors being less than a majority of lengths of the memory device command/address signal conductors.

8. The packaged integrated circuit of claim 7, wherein the host command/address signal conductors and the memory device command/address signal conductors comprise solder balls to connect the packaged integrated circuit to an external substrate.

9. The packaged integrated circuit of claim 7, wherein the host command/address interface circuits are connected to the host command/address signal conductors via conductive bumps on the memory buffer integrated circuit.

10. The packaged integrated circuit of claim 9, wherein the memory buffer integrated circuit die is mounted to the package substrate with the host command/address interface circuits facing the package substrate.

11. The packaged integrated circuit of claim 9, wherein an average length of the host command/address signal conductors is less than an average length of the memory device command/address signal conductors.

12. The packaged integrated circuit of claim 9, wherein each length of the host command/address signal conductors is less than an average length of the memory device command/address signal conductors.

13. The packaged integrated circuit of claim 9, wherein each length of the host command/address signal conductors is less than each length of a respective corresponding memory device command/address signal conductor.

14. A ball grid array (BGA) package, comprising:
a substrate comprising host command/address signal balls connected to host command/address signal conductors, and memory device command/address signal balls connected to memory device command/address signal conductors, the host command/address signal balls and the memory device command/address signal balls configured to electrically connect the BGA package to an external substrate; and a memory buffer integrated circuit, the host command/address signal balls connected to host command/address signal interface circuits of the memory buffer integrated circuit via the host command/address signal conductors, the memory device command/address signal balls connected to memory device command/address signal interface circuits of the memory buffer integrated circuit via the memory device command/address signal conductors, the memory buffer integrated circuit mounted to the substrate such that an average distance from host command/address signal interface circuits to the host command/address signal balls is less than a second average distance from the memory device command/address signal interface circuits to the memory device command/address signal balls.

15. The package of claim 14, wherein the external substrate is configured to include multiple memory devices and has a memory module form factor.

16. The package of claim 14, wherein a first average length of the host command/address signal conductors is less than a second average length of memory device command/address signal conductors.

17. The package of claim 14, wherein a majority of lengths of the host command/address signal conductors is less than a majority of lengths of memory device command/address signal conductors.

18. The package of claim 14, wherein each length of the host command/address signal conductors is less than an average length of memory device command/address signal conductors.

19. The package of claim 14, wherein each length of the host command/address signal conductors is less than a length of a corresponding memory device command/address signal conductor.

* * * * *